(12) United States Patent
Fukano

(10) Patent No.: US 7,990,760 B2
(45) Date of Patent: Aug. 2, 2011

(54) SEMICONDUCTOR SRAM WITH ALTERNATIVELY ARRANGED P-WELL AND N-WELL REGIONS

(75) Inventor: Guo Fukano, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 377 days.

(21) Appl. No.: 12/134,750

(22) Filed: Jun. 6, 2008

(65) Prior Publication Data

US 2008/0304313 A1 Dec. 11, 2008

(30) Foreign Application Priority Data

Jun. 7, 2007 (JP) ................................. 2007-151710

(51) Int. Cl.
*G11C 11/00* (2006.01)

(52) U.S. Cl. ............ 365/156; 365/63; 365/72; 365/188; 365/189.14; 365/189.05; 365/189.08; 365/190; 365/202; 365/214; 365/230.03

(58) Field of Classification Search .................... 365/63, 365/72, 154, 156, 188, 189.14, 189.05, 189.08, 365/190, 202, 214, 230.03
See application file for complete search history.

(56) References Cited

U.S. PATENT DOCUMENTS

| | | | |
|---|---|---|---|
| 5,930,163 A | 7/1999 | Hara et al. | |
| 5,966,341 A * | 10/1999 | Takahashi et al. | 365/230.03 |
| 6,178,134 B1 | 1/2001 | Evans et al. | |
| 6,535,453 B2 | 3/2003 | Nii et al. | |
| 6,677,649 B2 * | 1/2004 | Osada et al. | 257/379 |
| 6,898,111 B2 * | 5/2005 | Yamauchi | 365/154 |
| 7,239,163 B1 * | 7/2007 | Ralston-Good et al. | 324/763 |
| 7,310,256 B2 * | 12/2007 | Takemura et al. | 365/63 |
| 7,439,132 B2 * | 10/2008 | Tanaka et al. | 438/257 |
| 7,684,231 B2 * | 3/2010 | Hayashi et al. | 365/154 |
| 7,692,943 B2 * | 4/2010 | Osada et al. | 365/51 |
| 2007/0035986 A1 * | 2/2007 | Houston | 365/154 |
| 2008/0137393 A1 | 6/2008 | Fukano et al. | |

FOREIGN PATENT DOCUMENTS

JP    2001-28401    11/2001

OTHER PUBLICATIONS

Daewoong Kang, et al., "Improving the cell Characteristics Using Low-k Gate Spacer in 1Gb NAND Flash Memory", 2006 IEDM Dig., Dec. 2006, pp. 1001-1004. (Feb. 28, 2008).
Kevin Zhang, et al., "SRAM Design on 65-nm CMOS Technology with Dynamic Sleep Transistor for Leakage Reduction", IEEE Journal of Solid-State Circuits, vol. 40, No. 4, Apr. 2005, pp. 895-901.

* cited by examiner

*Primary Examiner* — Hoai V Ho
*Assistant Examiner* — Fernando N Hidalgo
(74) *Attorney, Agent, or Firm* — Oblon, Spivak, McClelland, Maier & Neustadt, L.L.P.

(57) ABSTRACT

A semiconductor memory device comprises a cell array having a plurality of SRAM cells arranged in a bit line direction and a word line direction orthogonal to said bit line direction in a matrix; and a peripheral circuit arranged adjacent to the cell array in the bit line direction. The cell array includes first P-well regions and first N-well regions shaped in stripes extending in the bit line direction and arranged alternately in the word line direction. The SRAM cell is formed point-symmetrically in the first P-well region and the first N-well regions located on both sides thereof. The peripheral circuit includes second P-well regions and second N-well regions extending in the bit line direction and arranged alternately in the word line direction.

14 Claims, 15 Drawing Sheets

Detail of A-portion

SEMICONDUCTOR SRAM WITH ALTERNATIVELY ARRANGED P-WELL AND N-WELL REGIONS

CROSS-REFERENCE TO RELATED APPLICATION

This application is based upon and claims the benefit of priority from prior Japanese Patent Application No. 2007-151710, filed on Jun. 7, 2007, the entire contents of which are incorporated herein by reference.

BACKGROUND OF THE INVENTION

1. Field of the Invention

The present invention relates to a semiconductor memory device comprising a cell array of point-symmetrically arranged SRAM (Static Random Access Memory) cells arrayed in a matrix.

2. Description of the Related Art

In general, an SRAM memory macro comprises an SRAM cell array having a plurality of SEAM cells arranged in a bit line and a word line direction in a matrix; and a peripheral circuit including a local sense amp, a row decoder, an I/O controller and other control circuits. In recent years, for the purpose of reducing parasitic capacities associated with bit lines to achieve fast access as the memory capacity increases, such an SRAM memory macro is known that includes multi-split SRAM cell arrays. In such the SRAM memory macro, local sense amps are each arranged between plural SRAM cell arrays aligned in the bit line direction, and an I/O controller is arranged at the end of series of the SRAM cell arrays. (Kevin Zhang, Uddalak Bhattacharya, Zhanping Chen, Fatih Hamzaoglu, Daniel Murray, Narendra Vallepalli, Yih Wang, B. Zheng, and Mark Bohr, "SRAM Design on 65-nm CMOS Technology With Dynamic Sleep Transistor for Leakage Reduction", IEEE JOURNAL OF SOLID-STATE CIRCUITS, VOL. 40, No. 4, APRIL 2005.)

Usually, an SRAM cell includes two sets of loads formed of P-channel MOS transistors, and two sets of drivers and transfers formed of N-channel MOS transistors, a total of 6 MOS transistors. The SRAM cell is laid out in a point-symmetric pattern within an N-well region and both-side P-well regions. More specifically, sources and drains of the transistors are aligned in parallel with a boundary line between well regions, and gates are arranged extending in a direction orthogonal to the boundary line (see U.S. Pat. No. 6,677,649, for example). The point-symmetric pattern is advantageous because a diffused layer is not L-shaped and the layout contains no uselessness. In accordance with the layout, P-well regions and N-well regions are patterned in stripes extending in the bit line direction and arranged alternately in the word line direction over the SRAM cell arrays.

In the local sense amps laid-out between the SRAM cell arrays and the I/O controller arranged at the end of a series of the SRAM cell arrays, P-well regions and N-well regions are shaped in stripes extending in parallel with the word line. If the SRAM cell arrays differ from the peripheral circuits in the arrangement direction of and the length of the well in this way, problems occur with respect to the following two points. First, it is required to interpose a process dummy SRAM cell between the SRAM cell array and the peripheral circuit. Second, variations in processing of wells become larger and deteriorate the characteristics of transistors.

SUMMARY OF THE INVENTION

An aspect of the present invention provides a semiconductor memory device, comprising: a cell array having a plurality of SRAM cells arranged in a bit line direction and a word line direction orthogonal to the bit line direction in a matrix; and a peripheral circuit arranged adjacent to the cell array in the bit line direction, wherein the cell array includes first P-well regions and first N-well regions shaped in stripes extending in the bit line direction and arranged alternately in the word line direction, wherein the SRAM cell is formed point-symmetrically in the first P-well region and the first N-well regions located on both sides thereof, wherein the peripheral circuit includes second P-well regions and second N-well regions extending in the bit line direction and arranged alternately in the word line direction.

Another aspect of the present invention provides a semiconductor memory device, comprising: a cell array having a plurality of SRAM cells arranged in a bit line direction and a word line direction orthogonal to the bit line direction in a matrix; and a peripheral circuit arranged adjacent to the cell array in the bit line direction, wherein the peripheral circuit includes a read circuit having second P-well regions and second N-well regions arranged alternately in the word line direction, a plane orthogonal to the word line is formed as a boundary plane between the regions, and operative to read data output from the SRAM cell in single-ended.

Yet another aspect of the present invention provides a semiconductor memory device, comprising: a cell array having a plurality of SRAM cells arranged in a bit line direction and a word line direction orthogonal to the bit line direction in a matrix; and a peripheral circuit arranged adjacent to the cell array in the bit line direction, wherein the cell array and the peripheral circuit include transistors formed therein with respective gates extending in the same direction.

DETAILED DESCRIPTION OF THE EMBODIMENTS

The embodiments of the present invention will now be described with reference to the drawings.

First Embodiment

Figure 1:
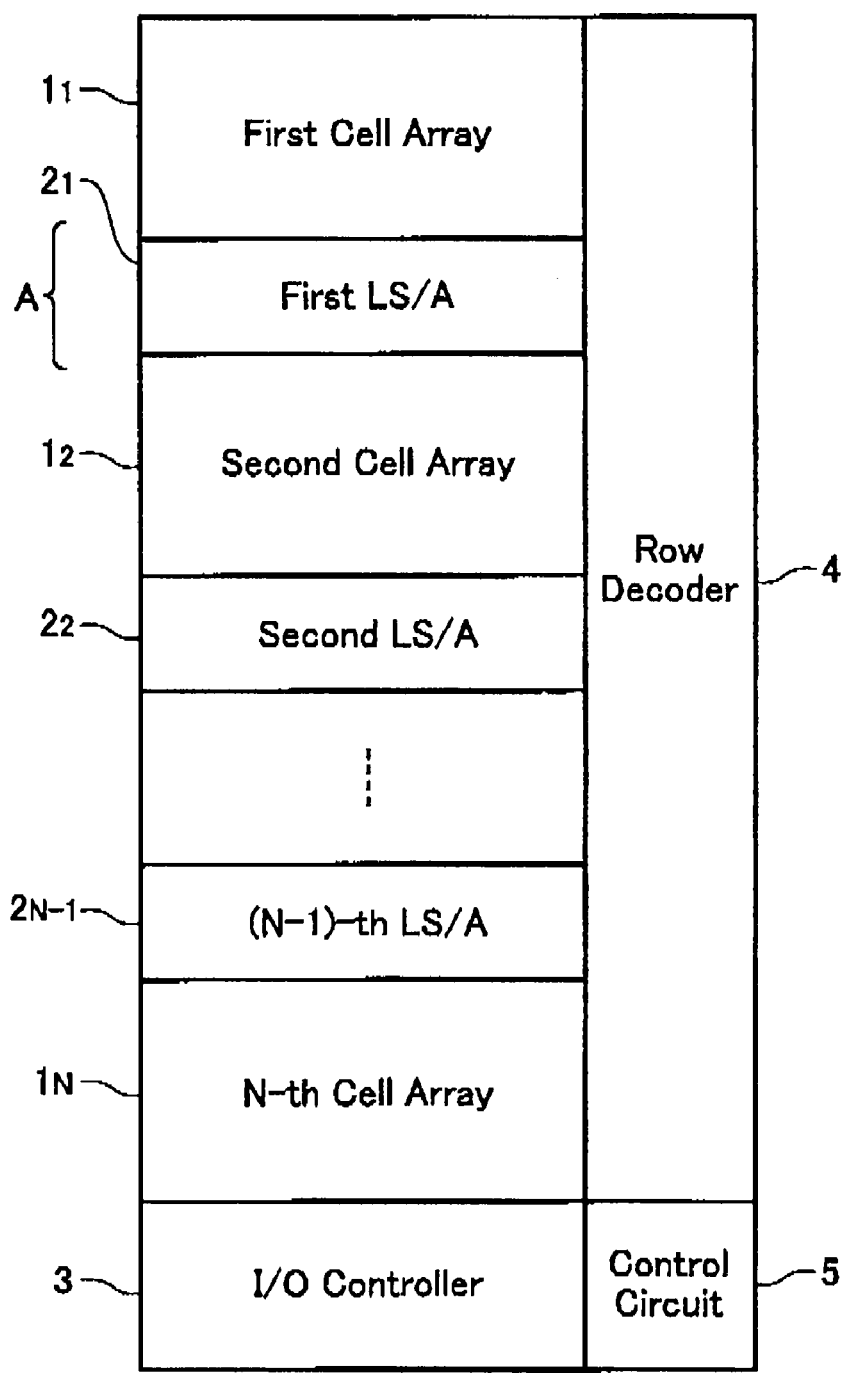
FIG. 1 is a plan view showing part of an SRAM according to a first embodiment of the present invention.

FIG. 1 is a plan view showing a memory macro part in an SRAM according to a first embodiment of the present invention.

The SRAM comprises plural cell arrays $1_1, 1_2, \ldots, 1_N$ and associated peripheral circuits arrayed in an extension direction of later-described bit lines BL, BLB. The peripheral circuits include local sense amps (LS/A's) $2_1, 2_2, \ldots, 2_{N-1}$ arranged between the cell arrays $1_1, 1_2, \ldots, 1_N$; an I/O controller 3 arranged at the end close to the N-th cell array $1_N$; a row decoder 4 arranged on the side of the cell arrays $1_1, 1_2, \ldots, 1_N$; and a control circuit 5 arranged at the end of the row decoder 4 close to the N-th cell array $1_N$.

Figure 2:
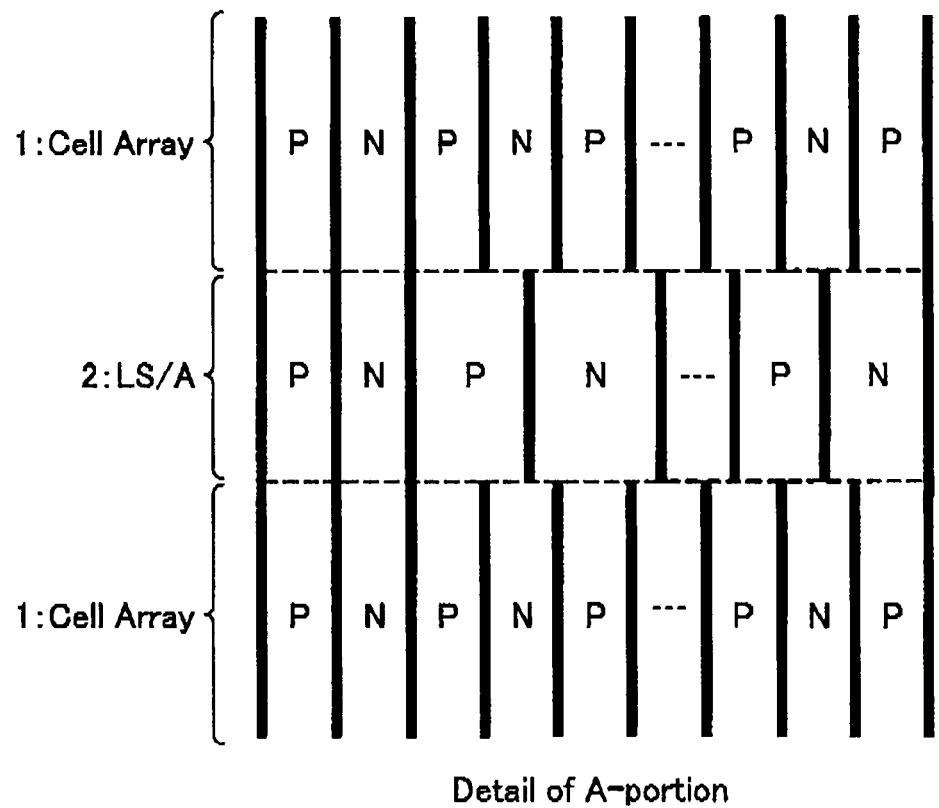
FIG. 2 is a plan view of details of A-portion in FIG. 1, showing a layout of well regions in cell arrays and LS/A's in the first embodiment.

FIG. 2 is a plan view of details of A-portion in FIG. 1, showing a layout of P-well regions and N-well regions in adjoining cell arrays 1 and LS/A's 2 located therebetween. In both the cell array 1 and the LS/A 2, P-well regions (P) and N-well regions (N) are shaped in stripes extending in the arrangement direction of the cell arrays 1, that is, in parallel with the bit lines BL, BLB and arranged alternately in a direction orthogonal to the arrangement direction of the cell arrays 1. The cell array 1 includes a plurality of SRAM cells arrayed and formed in the extension direction of bit lines BL, BLB and in the orthogonal extension direction of word lines in a matrix.

Figure 3:
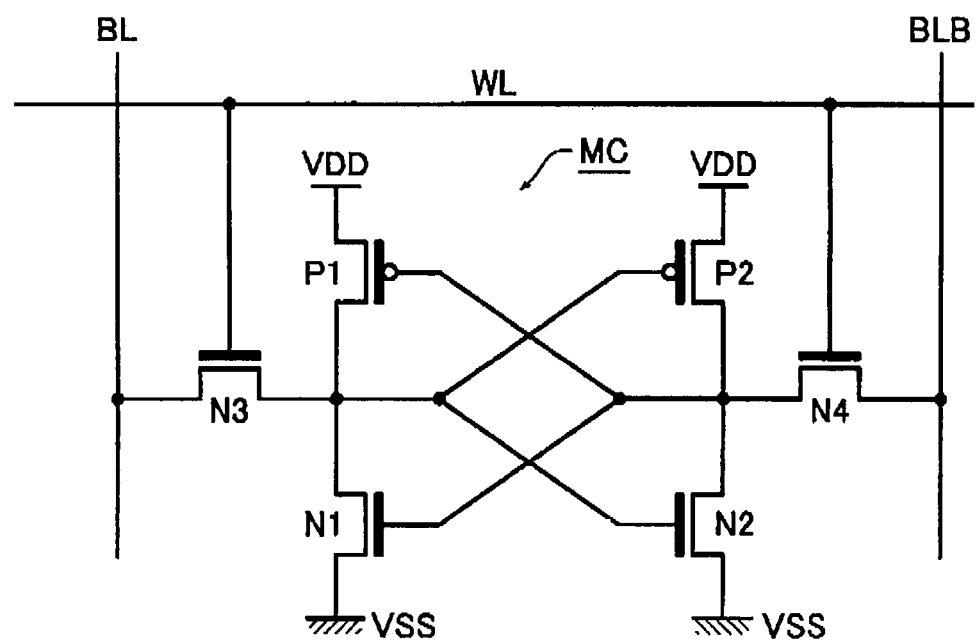
FIG. 3 is a circuit diagram of an SRAM cell in the same embodiment

FIG. 3 is a circuit diagram of a 6-transistor SRAM cell MC used in the same embodiment.

The SRAM cell MC includes a first P-channel MOS transistor P1 (first load) and a first N-channel MOS transistor N1 (first driver), which are complementarily connected and have respective sources connected with the supply line VDD and the ground line VSS, respectively; a second P-channel MOS transistor P2 (second load) and a second N-channel MOS transistor N2 (second driver), which are complementarily connected and have respective sources connected with the supply line VDD and the ground line VSS, respectively, a common gate connected with the common drain of the transistors P1, N1, and a common drain connected with the common gate of the transistors P1, N1; a third N-channel MOS transistor N3 (first transfer), which is connected between the common drain of the transistors P1, N1 and the first bit line BL and has a gate connected with the word line WL; and a fourth N-channel MOS transistor N4 (second transfer), which is connected between the common drain of the transistors P2, N2 and the second bit line BLB and has a gate connected with the word line WL.

Figure 4:
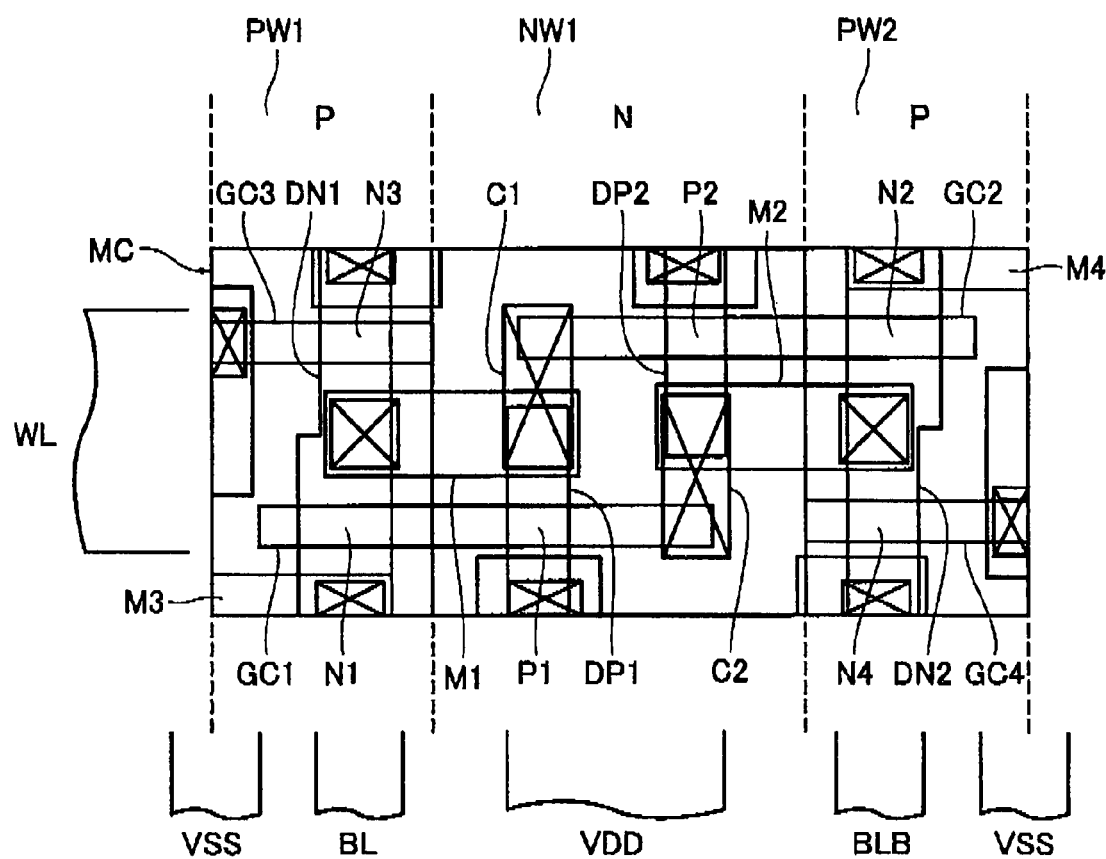
FIG. 4 is a plan view showing a layout of circuitry in the cell array of the same embodiment.

FIG. 4 is a plan view showing a layout of circuitry in the cell array 1 in the SRAM cell MC thus configured. This layout shows overlapped layouts of portions from the well regions to a first metal wiring layer. In a second and a third upper metal wiring layer, the word lines WL are formed crossing the well regions, and the bit line BL and the bit line BLB are formed in parallel along the well regions. The supply line VDD and the ground line VSS are arranged in parallel with the word line WL if the associated wiring layer for use in formation of the lines is equal to that of the word line WL. If it is equal to that of the bit lines BL, BLB, they are arranged in parallel with the bit lines BL, BLB. These lines may be formed in metal wiring layers as shown in the following Table 1.

TABLE 1

|        | WL | VDD | VSS | BL | BLB |
|--------|----|-----|-----|----|-----|
| Case 1 | 2  | 2   | 3   | 3  | 3   |
| Case 2 | 2  | 3   | 2   | 3  | 3   |
| Case 3 | 2  | 3   | 3   | 3  | 3   |
| Case 4 | 3  | 3   | 2   | 2  | 2   |
| Case 5 | 3  | 2   | 3   | 2  | 2   |
| Case 6 | 3  | 2   | 2   | 2  | 2   |

2: Second Metal Wiring Layer
3: Third Metal Wiring Layer

One SRAM cell MC is formed in a point-symmetrical pattern in three parallel well regions PW1, NW1, PW2 including an N-well region NW1 and both-side P-well regions PW1, PW2. The N-well region NW1 includes P-type diffused layers DP1, DP2 formed in stripes extending in parallel with the N-well region NW1. The P-well regions PW1, PW2 include N-type diffused layers DN1, DN2 formed in stripes extending in parallel with the P-well regions PW1, PW2. The four diffused layers DP1, DP2, DN1, DN2 are formed in stripes in parallel with the well regions in this way, thereby reducing the variations in processing among the diffused layers.

Along the P-type diffused layers DP1, DP2 in the N-well region NW1, P-channel MOS transistors P1, P2 are formed respectively. Along the N-type diffused layer DN1 in the P-well region PW1, N-channel MOS transistors N1, N3 are formed in series. Along the N-type diffused layer DN2 in the P-well region PW2, N-channel MOS transistors N2, N4 are formed in series. The transistors P1, N1 have a common gate GC1 formed of polysilicon in stripes crossing the boundary between the well regions NW1, PW1. The transistors P2, N2 have a common gate GC2 formed of polysilicon in stripes crossing the boundary between the well regions NW1, FW2. The transistors P1, N1 have respective drains connected with each other via a metal wiring layer M1 crossing the boundary between the well regions NW1, PW1 and connected with the common gate GC2 of the transistors P2, N2 via a contact C1. The transistors P2, N2 have respective drains connected with each other via a metal wiring layer M2 crossing the boundary between the well regions NW1, PW2 and connected with the common gate GC1 of the transistors P1, N1 via a contact C2. The transistors P1, N1 have respective sources connected via a contact with the supply line VDD in the upper layer. The transistors P1, N1 have respective sources connected with the ground line VSS via metal wiring layers M3, M4, respectively. The transistors N3, N4 have respective gates GC3, GC4 formed of polysilicon in stripes crossing the well regions PW1, PW2 and connected with the word line WL formed in the upper layer crossing the well regions. The transistors N3, N4 have respective sources connected via contacts with the bit lines BL, BLB formed in the upper layer.

Figure 5:
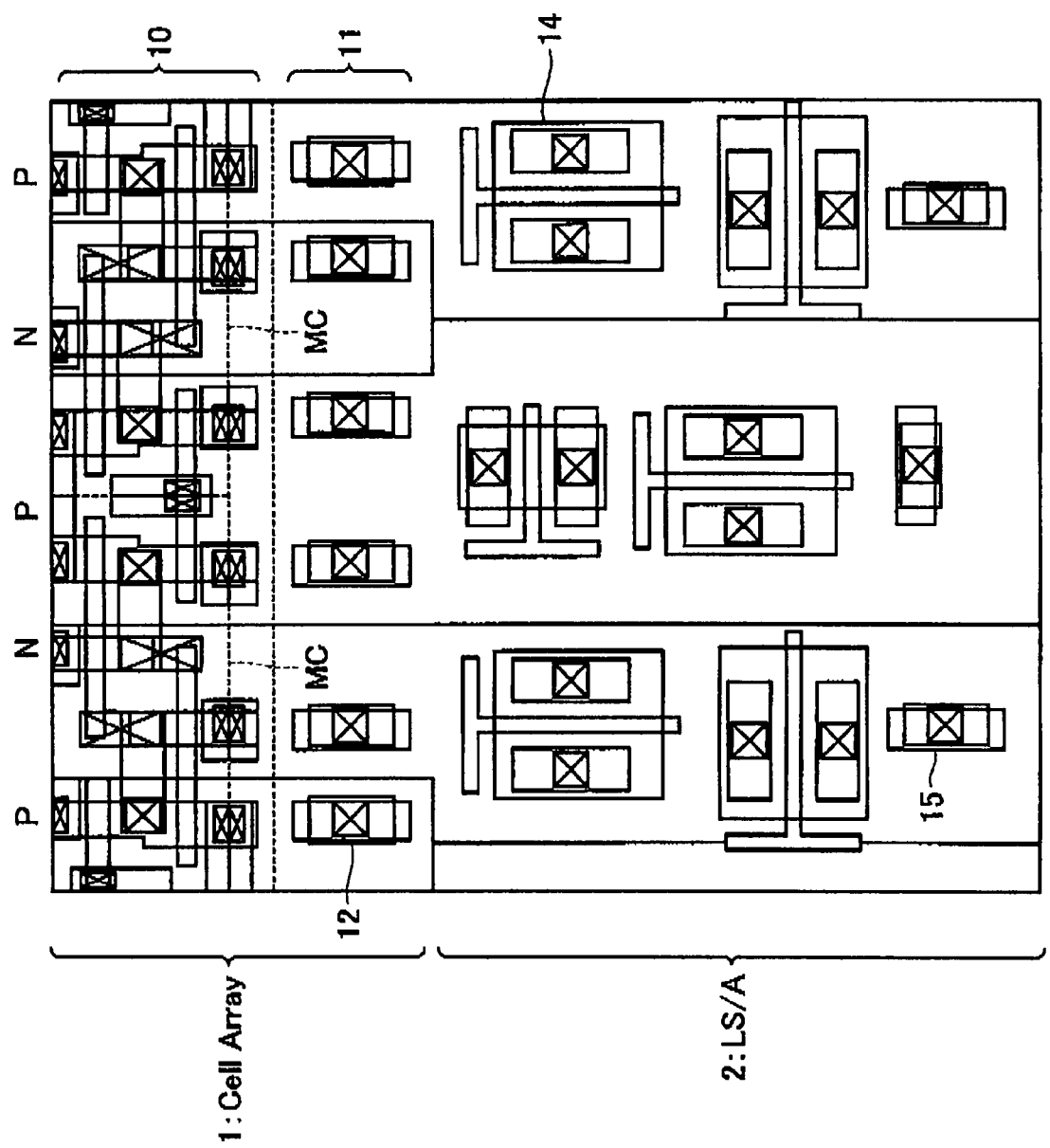
FIG. 5 is a plan view showing a layout of circuitry in cell arrays and LS/A's of the same embodiment.

FIG. 5 is a plan view showing a layout of circuitry in the cell array 1 of the above-described SRAM cells MC and the LS/A 2.

In a cell array area 10 of the cell array 1, the SRAM cells MC are formed in repeated patterns such that adjacent cells MC become line-symmetrical. In an area of the cell array 1 adjacent to the LS/A 2, a well contact (hereinafter referred to as "well-con") area 11 is formed for applying certain potentials to P-well regions and N-well regions. In the well-con area 11, well-cons 12 are formed for use in connections to the supply line, the ground line and a certain potential line, not shown, formed in the upper layer in the direction crossing P-well regions and N-well regions.

In the LS/A 2, P-well regions and N-well regions are formed extending in the same direction as P-well regions and N-well regions in the cell array 1. In these regions, transistors 14 are arranged in any directions to realize the function of the local sense amp, and well-cons 15 similar to the well-cons 12 in the cell array 1 are formed.

Figure 18:
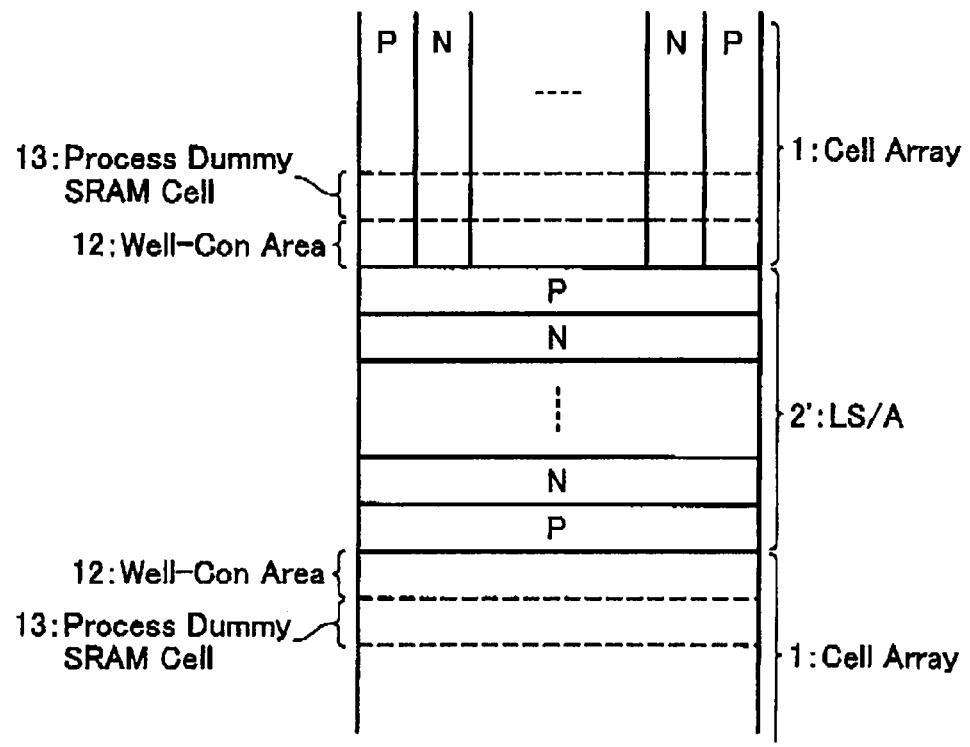
FIG. 18 is a plan view showing a layout of well regions in cell arrays and LS/A's of prior art.

For reference purposes, as shown in FIG. 18, in an SRAM memory macro of prior art, a cell array 1 differs from an LS/A 2' in extension direction of P-well regions and N-well regions. Accordingly, a well-con area 12 formed in an area of the cell array 1 in the vicinity of the LS/A 2' and a normal SRAM cell array require formation of a process dummy SRAM cell 13 therebetween for keeping the processability of normal SRAM cells. Therefore, the process dummy SRAM cell 13 increases the area of the cell array 1 correspondingly as a problem.

In the present embodiment, P-well regions and N-well regions in the LS/A 2 are formed in stripes extending in the same direction as P-well regions and N-well regions in the cell array 1. Accordingly, it needs no such process dummy cell and can reduce variations in processing of wells. In the present embodiment, the well regions in the LS/A 2 may have any widths and accordingly the transistors 14 can be arranged freely.

The arrangement directions of the well regions in the cell array 1 and the LS/A 2 are aligned in this example. Desirably, P-well regions and N-well regions in the I/O controller 3 are also aligned with P-well regions and N-well regions in the cell array 1.

Second Embodiment

Figure 6:
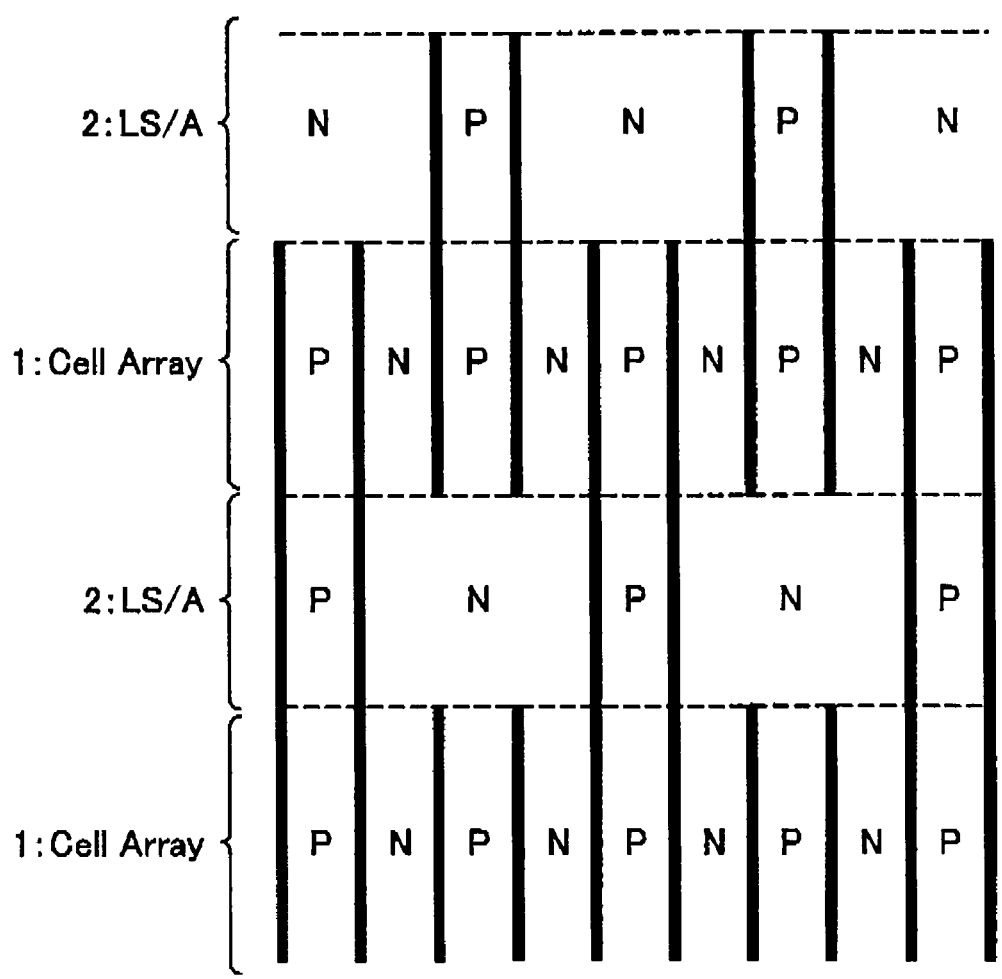
FIG. 6 is a plan view showing a layout of well regions in cell arrays and LS/A's in a second embodiment.

FIG. 6 is a plan view showing a layout of P-well regions and N-well regions in SRAM cell arrays 1 and LS/A's 2 according to a second embodiment of the present invention. In this embodiment, P-well regions and N-well regions in the cell array 1 and the LS/A 2 (and the I/O controller 3) are surely formed continuous between the cell array 1 and the LS/A 2 (and between the cell array 1 and the I/O controller 3), different from the preceding embodiment.

Figure 7:
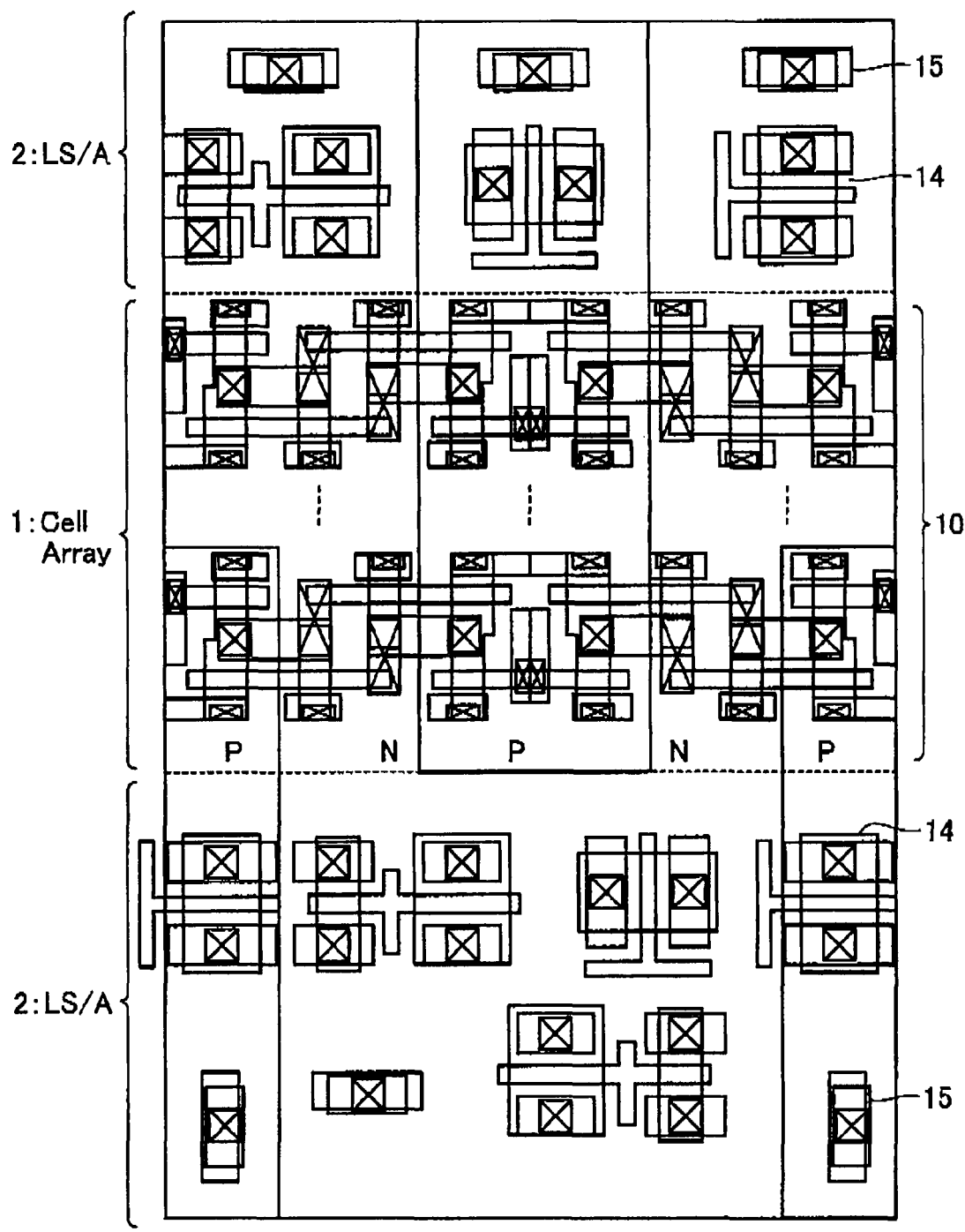
FIG. 7 is a plan view showing a layout of circuitry in cell arrays and LS/A's of the same embodiment.

FIG. 7 shows a layout of circuitry in the cell arrays 1 and the LS/A's 2 (and the I/O controller 3) of the present embodiment.

Figure 8:
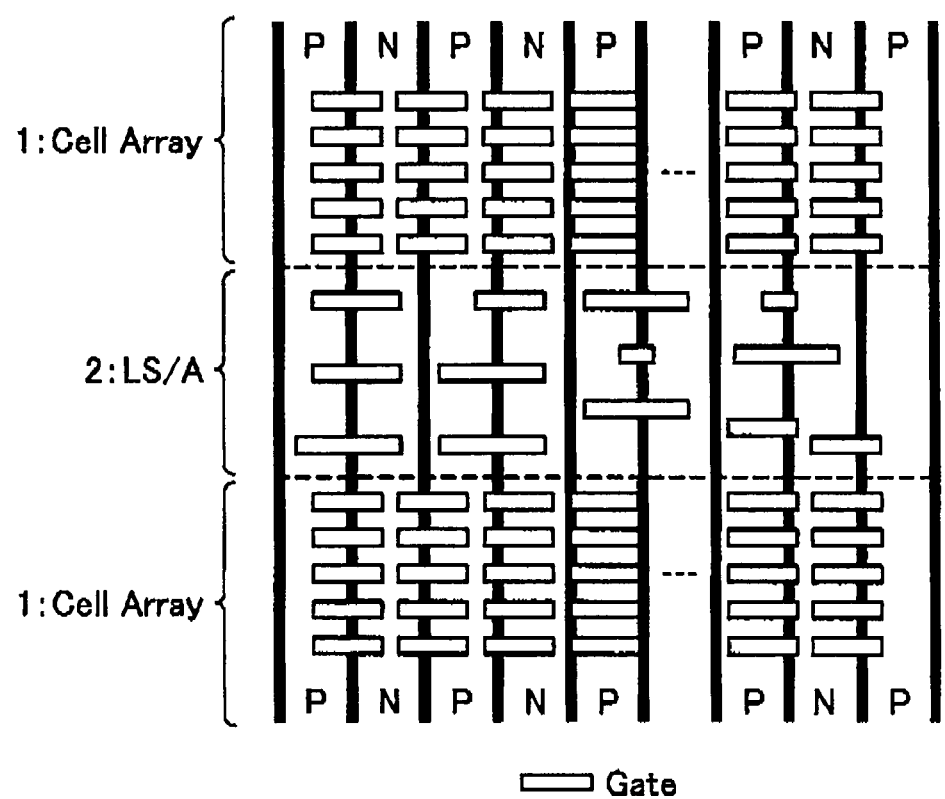
FIG. 8 is a plan view showing a layout of well regions in cell arrays and LS/A's in a third embodiment.

In this embodiment, P-well regions and N-well regions continue in the cell array 1 and the LS/A2 (and the I/O controller 3) and accordingly the cell array 1 and the LS/A 2 (and I/O controller 3) can share well-cons. Therefore, the well-con area 11 may be deleted from the cell array 1, and a well-con 15 may be formed only in the LS/A2 (and I/O controller 3) as an advantage, Third Embodiment FIG. 8 is a plan view showing a layout of P-well regions and N-well regions in SRAM cell arrays 1 and LS/A's 2 according to a third embodiment of the present invention, In this embodiment, P-well regions and N-well regions in the cell array 1 and P-well regions and N-well regions in the LS/A 2 (and the I/O controller 3) are formed continuous with the same width. In addition, the orientation of the gates of transistors is aligned with the orientation in parallel with the word line WL, different from the preceding embodiments.

Figure 9:
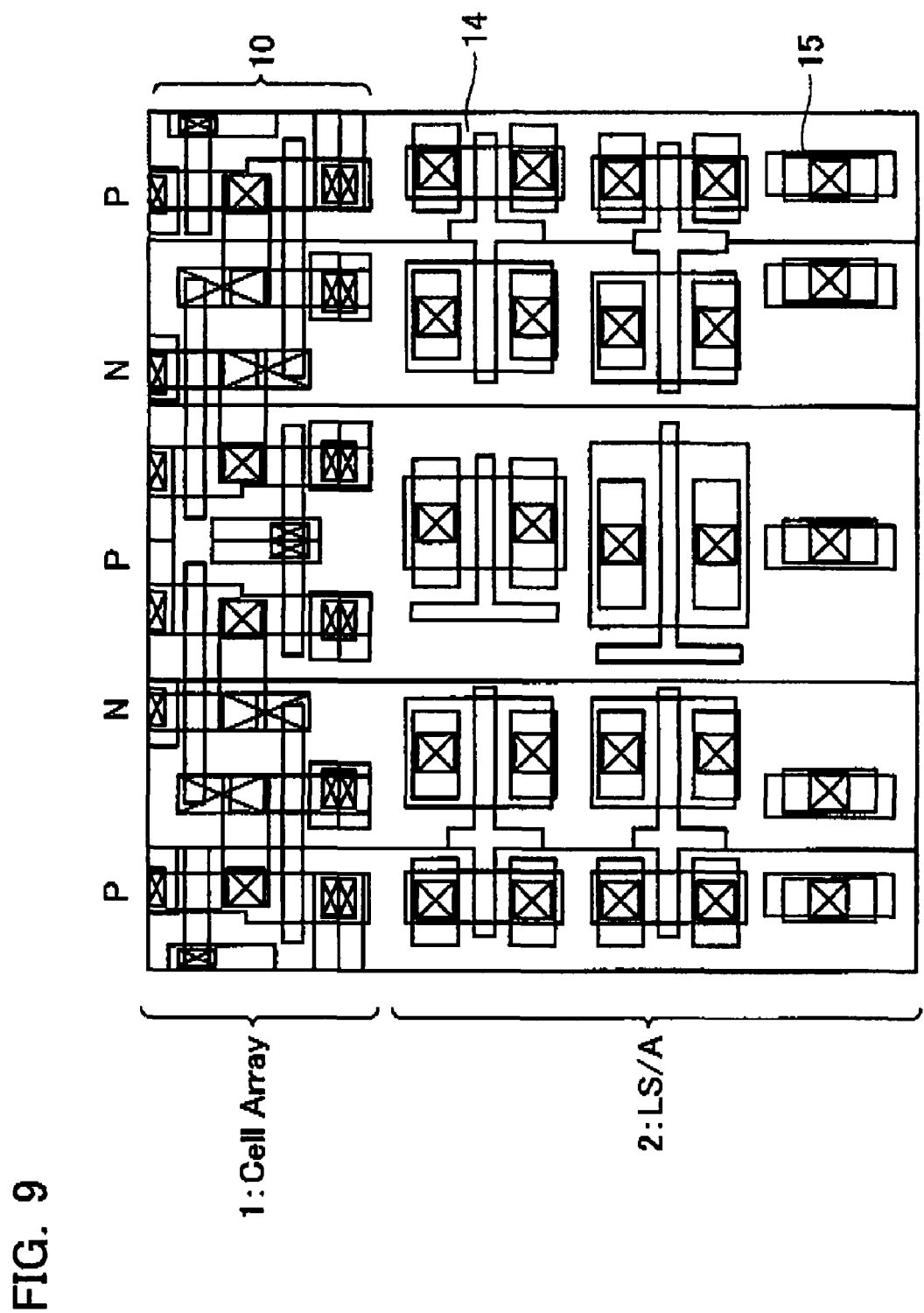
FIG. 9 is a plan view showing a layout of circuitry in cell arrays and LS/A's of the same embodiment.

FIG. 9 shows a layout pattern of the cell array 1 and the LS/A 2.

In this embodiment, the well regions continue with the same width in the cell array 1 and the LS/A2 (and the I/O controller 3). Accordingly, it is possible to further reduce variations in processing of wells.

Fourth Embodiment

Figure 10:
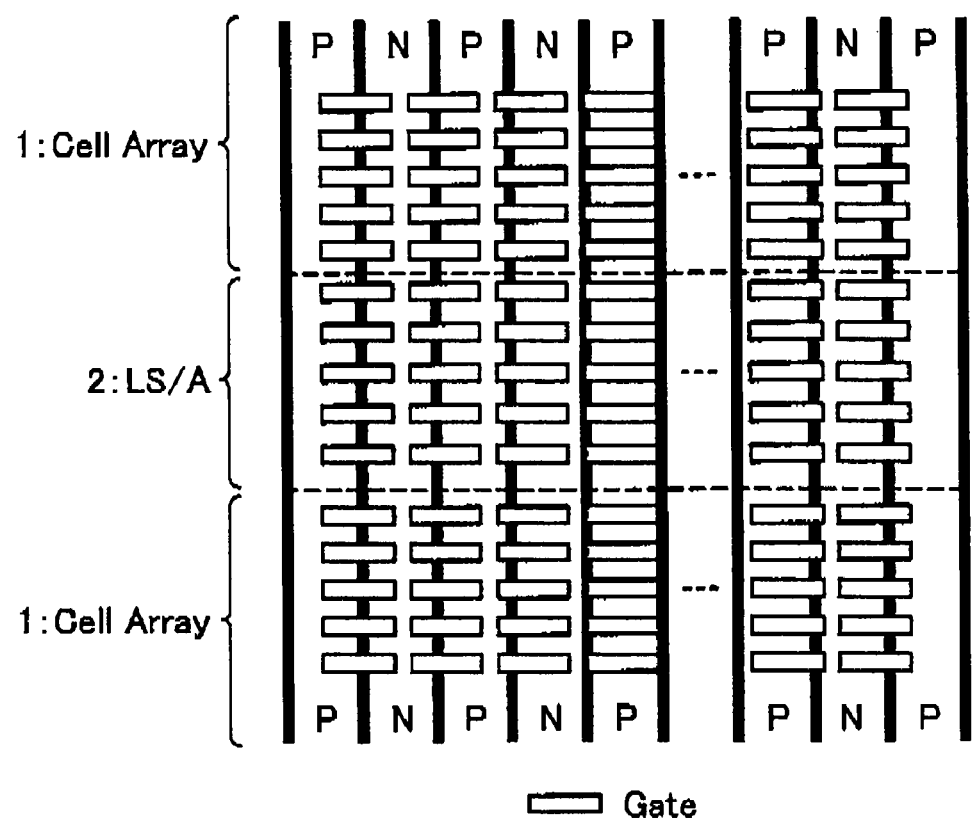
FIG. 10 is a plan view showing a layout of well regions in cell arrays and LS/A's in a fourth embodiment.

FIG. 10 is a plan view showing a layout of P-well regions and N-well regions in SRAM cell arrays 1 and LS/A's 2 according to a fourth embodiment of the present invention. In this embodiment, well regions are formed continuous with the same width in the cell array 1 and the LS/A 2 (and the I/O controller 3), and the orientation of the gates of transistors is aligned with the orientation in parallel with the wordline WL. In addition, the length of the gate of the transistor in each peripheral circuit is aligned with the length of the transistor in an adjacent SRAM cell, different from the preceding embodiments.

Figure 11:
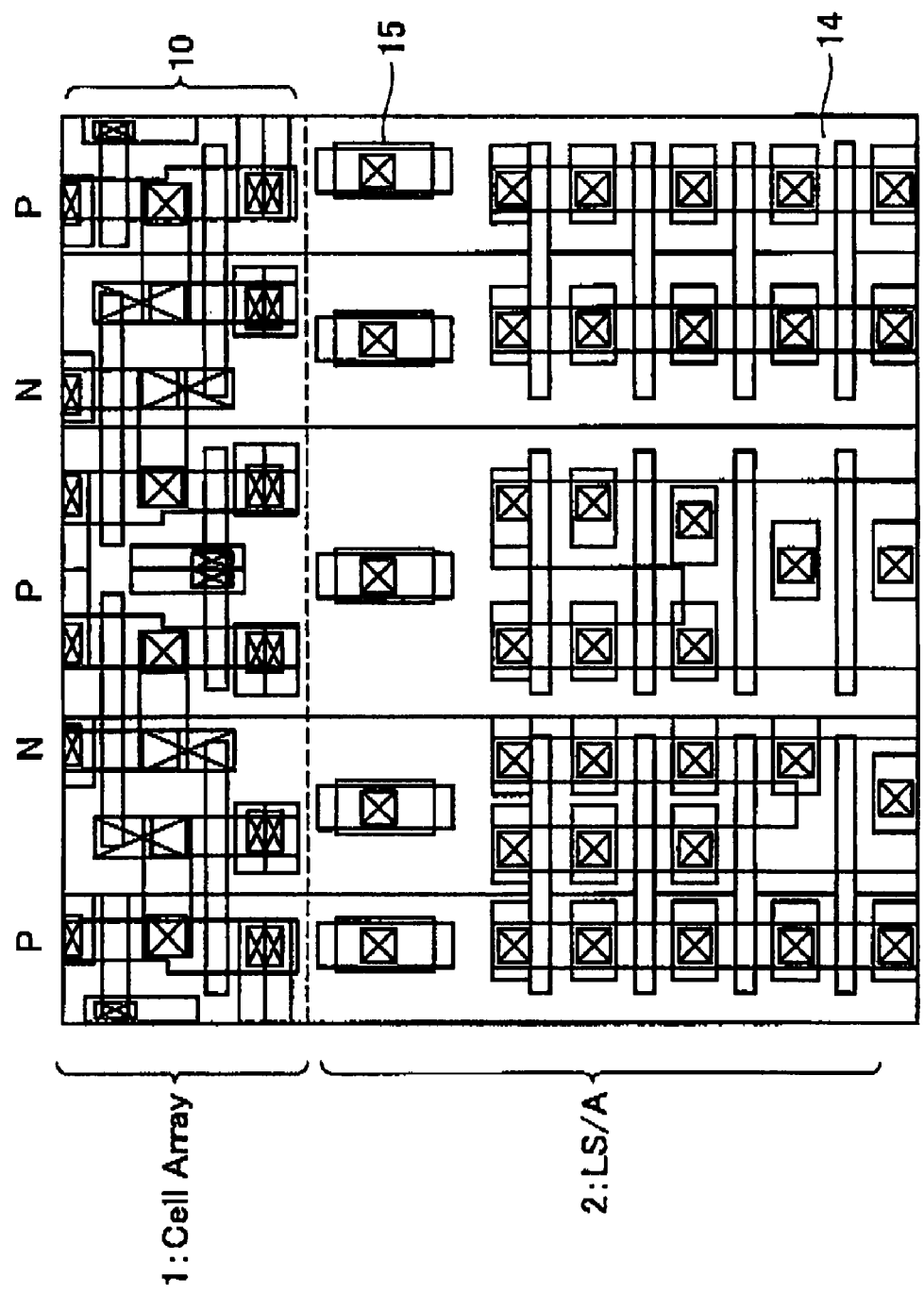
FIG. 11 is a plan view showing a layout of circuitry in cell arrays and LS/A's of the same embodiment.

FIG. 11 shows a layout pattern of the cell array 1 and the LS/A 2.

In this embodiment, in addition to the orientation of the gate of the transistor contained in the cell array 1, the orientation of the gate of the transistor contained in the LS/A 2 is also arranged in parallel with the wordline WL. Accordingly, it is possible to reduce variations in processing of wells to prevent variations in characteristic of the transistors.

Fifth Embodiment

Figure 12:
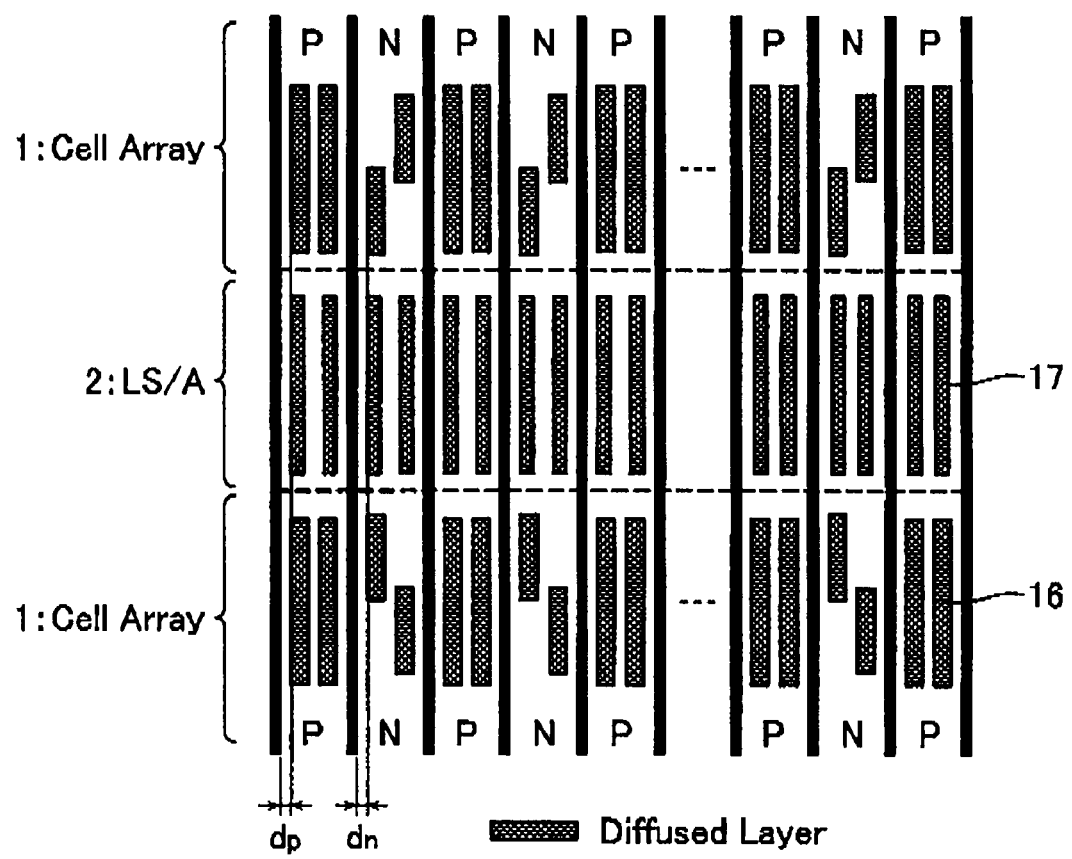
FIG. 12 is a plan view showing a layout of well regions in cell arrays and LS/A's in a fifth embodiment.

FIG. 12 is a plan view showing a layout of P-well regions and N-well regions in SRAM cell arrays 1 and LS/A's 2 according to a fifth embodiment of the present invention. In this embodiment, well regions are formed continuous with the same width in the cell array 1 and the LS/A 2 (and the I/o controller 3). In addition, diffused layers 16 in well regions in the cell array 1 and diffused layers 17 in well regions in the LS/A 2 (and the I/O controller 3) are formed in stripes extending in parallel with the well regions, different from the preceding embodiments.

By forming not only the diffused layers 16 but also the diffused layers 17 along the well regions in this way, it is possible to reduce variations in processing of the diffused layers 16, 17 as well.

Sixth Embodiment

A sixth embodiment is configured such that in the SRAM shown in FIG. 12 the distances dp, dn from the diffused layers 16, 17 to the boundary lines between well regions are made constant in P-wells and N-wells, respectively.

When the distances dp, dn from the diffused layers to the boundary lines between well regions are identical over all diffused layers, it is possible to further reduce variations in processing.

Seventh Embodiment

Figure 13:
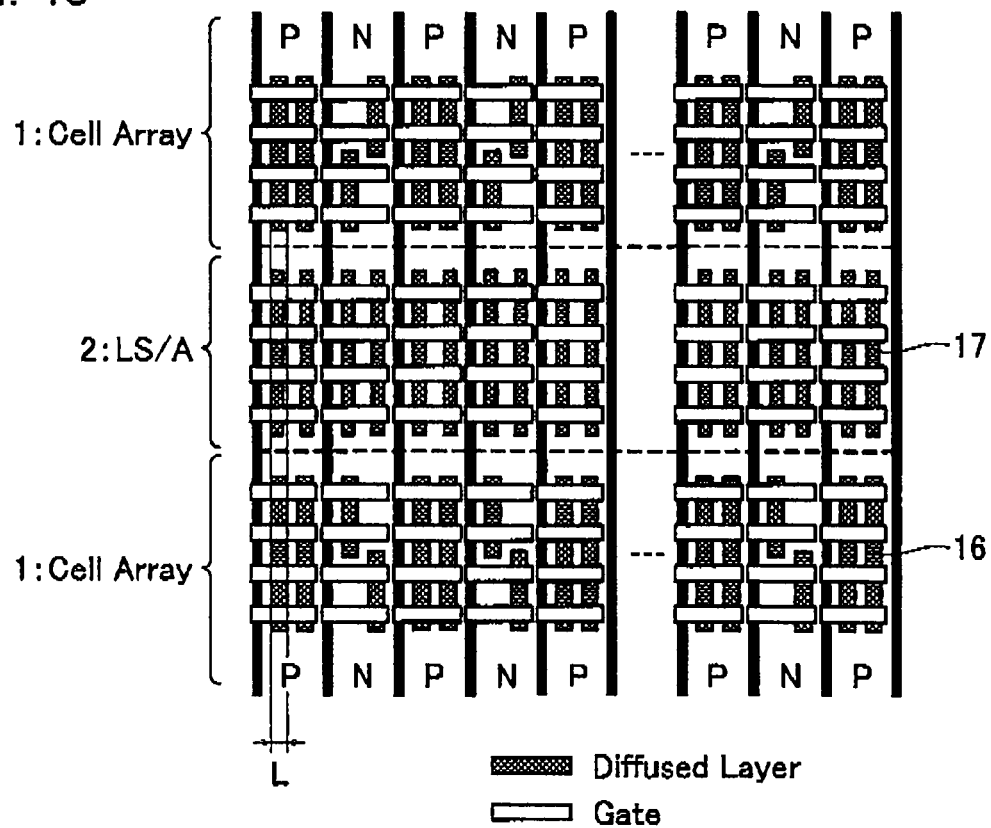
FIG. 13 is a plan view showing a layout of well regions in cell arrays and LS/A's in a seventh embodiment.

FIG. 13 is a plan view showing a layout of P-well regions and N-well regions in SRAM cell arrays 1 and LS/A's 2 according to a seventh embodiment of the present invention. In this embodiment, the diffused layers 16, 17 are formed with an equal gate width L, in addition to the sixth embodiment. Formation of the equal gate width L in this way makes it possible to further reduce variations in processing.

Eighth Embodiment

Figure 14:
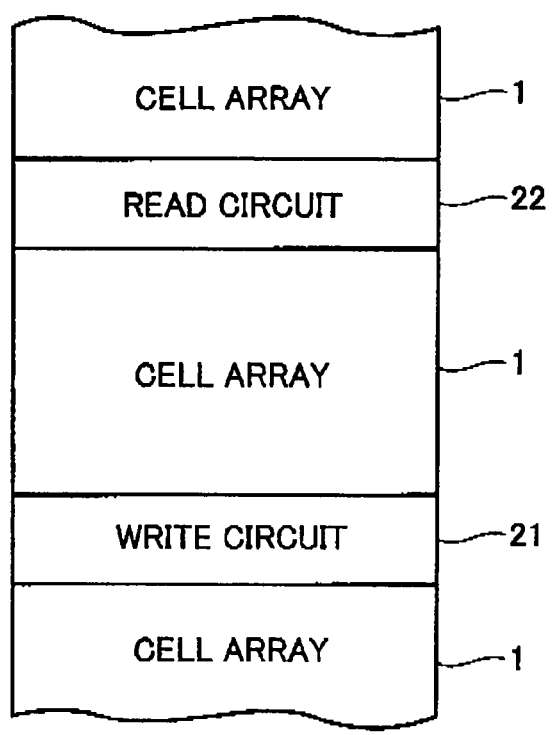
FIG. 14 is a plan view showing part of an SRAM in an eighth embodiment.

FIG. 14 is a plan view showing part of an SRAM in an eighth embodiment of the present invention.

SRAM cells MC in this SRAM have the same circuitry and layout as those in FIGS. 3 and 4. Peripheral circuits, however, include a plurality of write circuits 21 operative to write data in the SRAM cells MC, and a plurality of read circuits 22 operative to read data out of the SRAM cells MC. These write circuits 21 and read circuits 22 alternately locate between cell arrays 1 aligned in the bit line direction. The write circuits 21 and the read circuits 22 are each shared by two adjacent cell arrays 1, The write circuit 21 and the read circuit 22 are descried next in detail.

Figure 15:
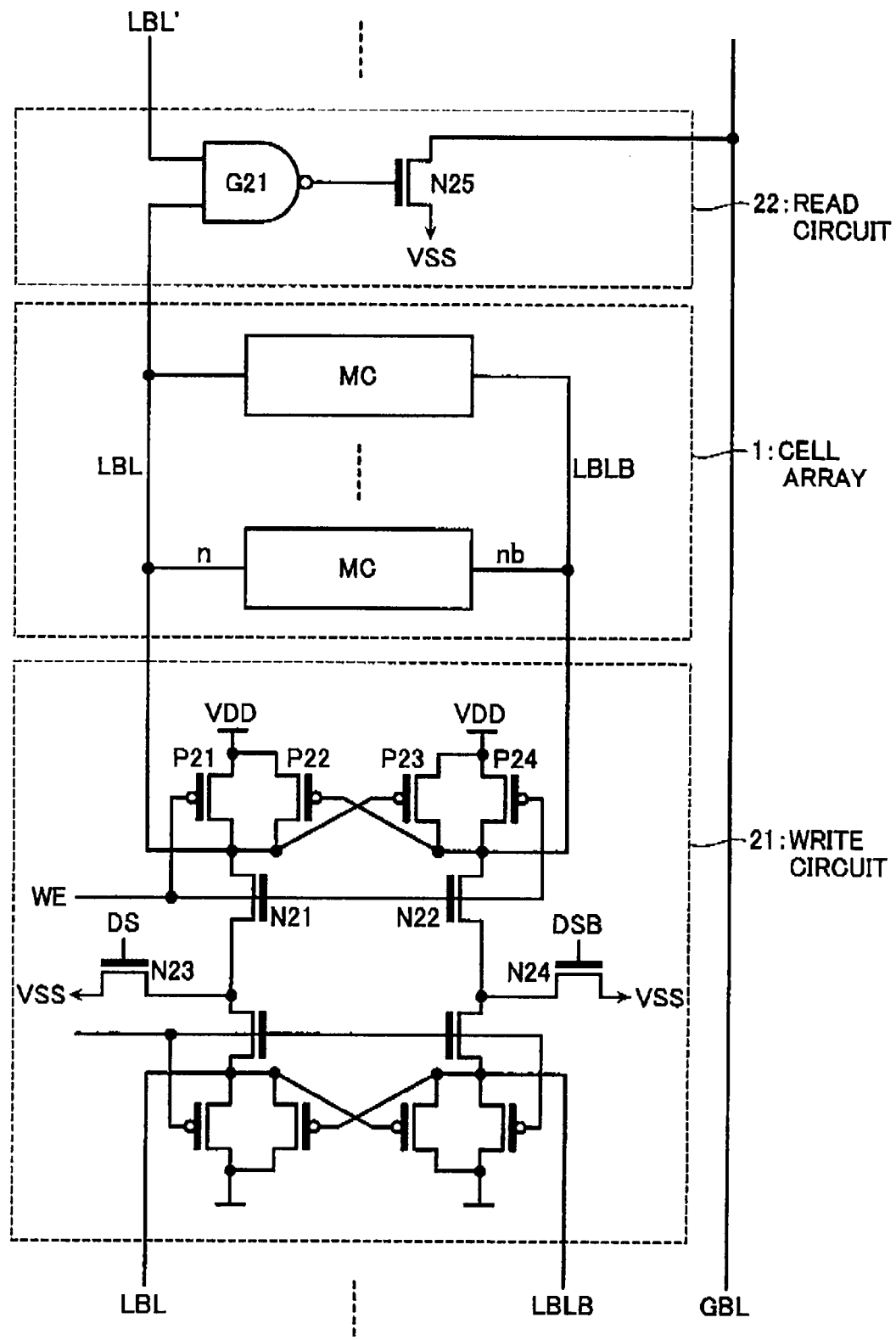
FIG. 15 is a circuit diagram showing a cell array, a write circuit and a read circuit of the same embodiment.

FIG. 15 is a circuit diagram showing the cell array 1, the write circuit 21 and the read circuit 22 in the present embodiment.

The SRAM cell MC in the cell array 1 has the same circuitry as that in FIG. 3 as described above. In the present embodiment, however, lines individually contained in each cell array 1 and corresponding to the bit lines BL, BLB of FIG. 3 are referred to as a first LBL and a second LBLB local bit line.

The write circuit 21 includes P-channel MOS transistors P21, P22 connected between the supply line VOD and the first local bit line LBL, and P-channel MOS transistors P23, P24 connected between the supply line VDD and the second local bit line LBLB. The P-channel MOS transistors P22 and P23 have respective gates connected with the second LBLB and the first LBL local bit line, respectively. The first and the second local bit lines LBL and LBLB are connected with the ground line VSS via N-channel MOS transistors N21, N23 and N22, N24, respectively, which are driving circuits. The P-channel MOS transistors P21, P24 and the N-channel MOS transistors N21, N22 are controlled by a write enable signal WE in positive logic given from the peripheral circuit for enabling write. The N-channel MOS transistors N23 and N24 are controlled by a first data selection signal DS and a second data selection signal DSB in reverse logic of the first data selection signal. The first and second data selection signals DS and DSB are signals that are made "L" and "H" on writing "1" into the SRAM cell MC.

The read circuit 22 includes a NAND gate G21, which is a gate element receiving the input of the first local bit lines LBL, LBL' from two cell arrays 1 adjacent to the read circuit 22, It also includes an N-channel MOS transistor N25, through which a global bit line GBL for use in transmission of data to external from the SRAM cell MC can be connected with the ground line VSS. The N-channel MOS transistor N25 is controlled by the output from the NAND gate G21. The read circuit 22 is a single-ended circuit configured to read data only from the first local bit line LBL.

Operation of the present embodiment is described next.

First, data writing is described for writing "1" in an SRAM cell MC. In this case, "H" and "L" are held on cell-nodes n and nb of the SRAM cell MC.

Usually, the write enable signal WE is kept inactive (at "L"). In this case, the P-channel MOS transistors P21 and P24 are turned on such that the first and second local bit lines LBL and LBLB are both connected with the supply line VDD to precharge the local bit lines LBL and LBLB to "H".

In this state, when the write enable signal WE is turned to "H" and the first and second data selection lines DS and DSB are turned to "L" and "H", the transistors P21, P24 and N23 are turned off and the transistors N21, N22 and N24 are turned on. Consequently, the second local bit LBLB is disconnected from the supply line VDD and connected with the ground line VSS. Therefore, the second local bit line LBLB precharged to "H" is pulled down to "L". On the other hand, the first local bit line LBL is kept in connection with the supply line VDD because the second local bit line LBLB is pulled down to "L" to turn on the P-channel MOS transistor P22 even though the P-channel MOS transistor P21 is turned off. In this state, when the word line WL is turned to "H", the first and second transfers N3 and N4 in the SRAM cell MC are turned on to supply "H" and "L" to the cell-nodes n and nb, respectively. Thus, writing data "1" in the SRAM cell MC is completed.

Subsequently, data reading is described on the assumption that "L" and "H" are held on the cell-nodes n and nb of the SRAM cell MC hold. In addition, the first local bit lines LBL and LBL' are precharged to "H" as well as the global bit line GBL.

In this state, when the word line WL is selected and the first and second transfers N3 and N4 in the SRAM cell MC are turned on, the first local bit line LBL is connected with the ground line VSS via the N-channel MOS transistors N1 and N3 shown in FIG. 3. Consequently, the first local bit line LBL is pulled down to "L". At this time, the first local bit line LBL' in another adjacent cell array is at "H". Accordingly, the output from the NAND gate G21 is determined from the level on the read-targeted first local bit line LBL to, in this example, "H", which turns on the N-channel MOS transistor N25. As a result, the global bit line GBL is connected with the ground line VSS and pulled down to "L". By sensing the voltage level on the global bit line GBL, data reading is completed. After the first and second transfers N3 and N4 in the SRAM cell MC are turned on, "L" is applied to the first local bit line LBL. Consequently, the P-channel MOS transistor P23 is turned on such that the second local bit line LBLB is connected with the supply line VDD. In contrast, when the cell-nodes n and nb are at "H" and "L", the first local bit line LBL is connected with the supply line VDD. This operation stabilizes the voltage levels on the first and second local bit lines LBL, LBLB and relieves the problem about disturbance on data reading.

An arrangement of wells in the present embodiment is described next.

Figure 16:
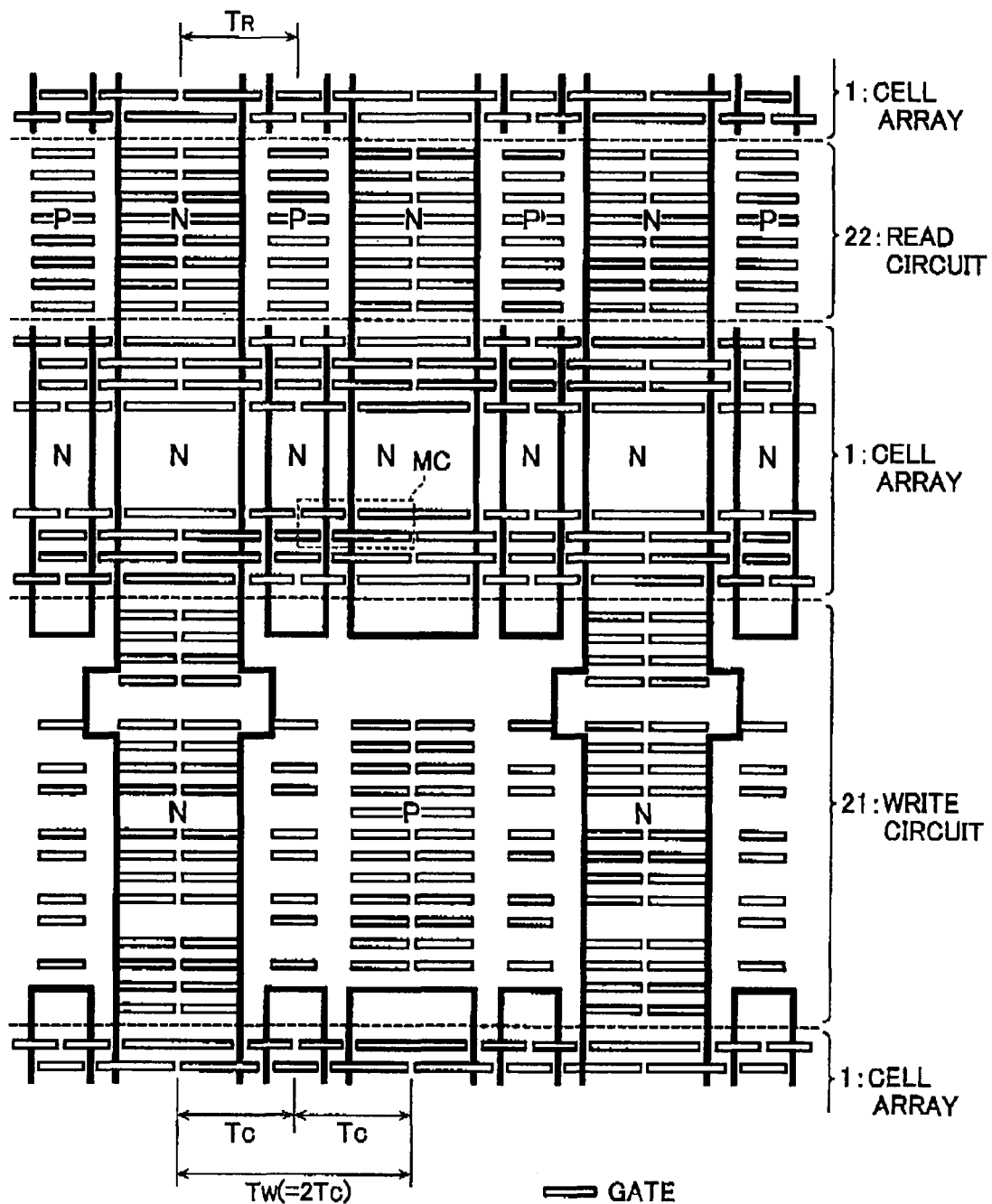
FIG. 16 is a plan view showing a layout of well regions in the cell array, the write circuit and the read circuit of the same embodiment.

FIG. 16 is a plan view showing a layout of well regions in the cell array, the write circuit and the read circuit of the same embodiment.

In the present embodiment, P-well regions and N-well regions in the cell array 1, the write circuit 21 and the read circuit 22 are formed in stripes extending in the same direction. In a relation between the cell array 1 and the write circuit 21, a basic pattern in the write circuit 21 repeats at a period ($T_W$), which corresponds to two periods ($2T_C$) of a circuit pattern of the SRAM cell MC in the cell array 1. In a relation between the cell array 1 and the read circuit 22, on the other hand, basic patterns in the write circuit 21 and the read circuit 22 repeat at the same period ($T_C=T_R$). Further, the orientation of all gates formed in the cell array 1, the write circuit 21 and the read circuit 22 is aligned with the orientation in parallel with the word line WL direction.

The basic pattern in the read circuit 22 may be formed not at the same period as the circuit pattern of the SRAM cell but at a period of an integer multiple thereof.

Much of the SRAM memory macros of prior art, also shown in FIG. 18, have used a differential amplifier as the LS/A 2'. The differential amplifier senses and amplifies a signal appeared across a pair of complementary bit lines and accordingly requires transfer transistors for receiving the pair of bit lines. The transfer transistors comprise N-channel MOS transistors. Accordingly, formation of P-well regions is required to arrange two N-channel MOS transistors in the vicinity of the boundary with the cell array 1. The transistors contained in the LS/A 2' is required to have a higher driving force than the transistors contained in the SRAM cell MC. Accordingly, the LS/A 2' is required to increase the size of the transistors individually. Therefore, the arrangement of wells in the direction orthogonal to the bit line in the cell array 1 is more convenient from the viewpoint of an easy arrangement of the LS/A 2'.

In this regard, the read circuit is single-ended in the present embodiment. Accordingly, it is possible to reduce the P-well regions for arranging transfer transistors or N-channel MOS transistors. Therefore, it is possible to achieve an easier circuitry arrangement even though P-well regions and N-well regions are formed in stripes extending in the bit line direction. A circuitry arrangement extended in the bit line direction allows a layout width in the word line direction to be adjusted equal to or several times the SRAM cell MC. This makes it possible to keep the periodicity of layouts between the write circuit 21 and the cell array 1 and between the cell array 1 and the read circuit 22.

As described above, this embodiment makes it possible to reduce variations in processing of wells in the cell array 1, the write circuit 21 and the read circuit 22.

As the present embodiment applies the single-ended system, it is capable of stabler data reading if the N-channel MOS transistor N1, which is a first drive element operative to drive the first local bit line LBL to the ground potential VSS, has a higher driving force than the N-channel MOS transistor N2, which is a second drive element operative to drive the second local bit line LBLB to the ground potential VSS in the SRAM cell MC. In this case, the N-channel MOS transistors N1 and N2 have a difference in size, which impairs the symmetry of the layout of the SRAM cell MC. Even in this case, the periodicity of the layouts of the cell array 1, the write circuit 21 and the read circuit 22 can not impaired, and the same effect can be exerted as above.

Figure 17:
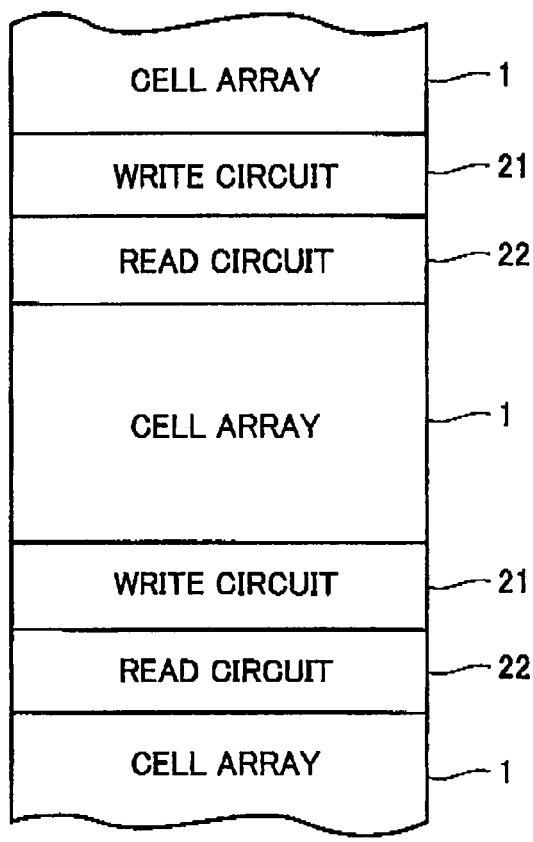
FIG. 17 is a plan view showing part of another SRAM in the same embodiment.

The arrangement of the write circuit 21 and the read circuit 22 relative to the cell array 1 is not limited to the example shown in FIG. 14. As shown in FIG. 17, with respect to one cell array 1, one write circuit 21 and one read circuit 22 may be arranged on both sides of the cell array 1 in the bit line direction.

What is claimed is:

1. A semiconductor memory device, comprising:
a cell array having a plurality of SRAM cells arranged in a bit line direction and a word line direction orthogonal to said bit line direction in a matrix; and
a peripheral circuit arranged adjacent to said cell array in said bit line direction,
wherein said cell array includes first P-well regions and first N-well regions shaped in stripes extending in said bit line direction and arranged alternately in said word line direction, wherein said SRAM cell is formed point-symmetrically in said first P-well region and said first N-well regions located on both sides thereof,
said peripheral circuit includes second P-well regions and second N-well regions extending in said bit line direction and arranged alternately in said word line direction, and includes a read circuit arranged adjacent to one side of said cell arrays in said bit line direction and operative to read data from said SRAM cell, and
said read circuit is arranged such that the length of a basic circuit pattern thereof in said word line direction is equal to an integer multiple of the length of a circuit pattern of said SRAM cell in said word line direction.

2. The semiconductor memory device according to claim 1, wherein said first and second P-well regions and said first and second N-well regions are respective continued regions.

3. The semiconductor memory device according to claim 1, wherein said first and second P-well regions and said first and second N-well regions are respective continued regions with the same width.

4. The semiconductor memory device according to claim 1, wherein said cell array and said peripheral circuit include transistors formed therein with respective gates extending in said word line direction.

5. The semiconductor memory device according to claim 1, wherein said first and second P-well regions and said first and second N-well regions include diffused layers formed therein, which are shaped in stripes in parallel with the extension direction of said well regions.

6. The semiconductor memory device according to claim 1, wherein said peripheral circuit includes a write circuit arranged adjacent to the other side of said cell arrays in said bit line direction and operative to write data to said SRAM cell.

7. A semiconductor memory device, comprising:
a cell array having a plurality of SRAM cells arranged in a bit line direction and a word line direction orthogonal to said bit line direction in a matrix; and
a peripheral circuit arranged adjacent to said cell array in said bit line direction,
wherein said peripheral circuit includes a read circuit having second P-well regions and second N-well regions arranged alternately in said word line direction, a plane orthogonal to said word line is formed as a boundary plane between said regions, and operative to read data output from said SRAM cell in single-ended, and
said read circuit is arranged such that the length of a basic circuit pattern thereof in said word line direction is equal to an integer multiple of the length of a circuit pattern of said SRAM cell in said word line direction.

8. The semiconductor memory device according to claim 7, wherein said peripheral circuit includes a write circuit arranged adjacent to one side of said cell arrays in said bit line direction and operative to write data to said SRAM cell, wherein said read circuit is arranged adjacent to the other side of said cell arrays in said bit line direction.

9. The semiconductor memory device according to claim 8, wherein said bit line includes a first and a second local bit lines,
wherein said write circuit includes a first driving circuit operative to selectively connect said first and second local bit lines with the ground line via a transfer gate, wherein said first driving circuit is activated at the time of writing data to said SRAM cell, wherein said first driving circuit is inactivated at the time other than writing data to said SRAM cell.

10. The semiconductor memory device according to claim 7, wherein said bit line includes a first and a second local bit lines and a global bit line,
wherein said read circuit includes a gate element having an input terminal connected with said first local bit line, and a second driving circuit operative to connect said global bit line with the ground line in response to the output from said gate element.

11. The semiconductor memory device according to claim 7, wherein said bit line includes a first and a second local bit lines, wherein said read circuit is operative to read data via said first local bit line, wherein said SRAM cell includes a first and a second drive elements operative to drive said first and second local bit lines to the ground potential, said first drive element having a higher driving force than said second drive element.

12. A semiconductor memory device, comprising:

a cell array having a plurality of SRAM cells arranged in a bit line direction and a word line direction orthogonal to said bit line direction in a matrix; and a peripheral circuit arranged adjacent to said cell array in said bit line direction, wherein said cell array and said peripheral circuit include transistors formed therein with respective gates extending in the same direction, said peripheral circuit includes a read circuit arranged adjacent to one side of said cell arrays in said bit line direction and operative to read data from said SRAM cell, and said read circuit is arranged such that the length in said word line direction is equal to an integer multiple of the layout of said SRAM cell.

13. The semiconductor memory device according to claim 12, wherein said peripheral circuit includes a write circuit arranged adjacent to the other side of said cell arrays in said bit line direction and operative to write data to said SRAM cell.

14. The semiconductor memory device according to claim 12, wherein said bit line includes a first and a second local bit lines, wherein said read circuit is operative to read data via said first local bit line, and said SRAM cell includes a first and a second drive elements operative to drive said first and second local bit lines to the ground potential, said first drive element having a higher driving force than said second drive element.

* * * * *